United States Patent
Zhu et al.

(10) Patent No.: US 7,476,593 B2
(45) Date of Patent: Jan. 13, 2009

(54) SEMICONDUCTOR DEVICE AND METHOD OF FORMING THE SAME

(75) Inventors: Ronghua Zhu, Chandler, AZ (US); Amitava Bose, Tempe, AZ (US); Vishnu K. Khemka, Phoenix, AZ (US); Vijay Parthasarathy, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 408 days.

(21) Appl. No.: 11/426,815

(22) Filed: Jun. 27, 2006

(65) Prior Publication Data

US 2006/0244081 A1 Nov. 2, 2006

Related U.S. Application Data

(62) Division of application No. 10/836,170, filed on Apr. 30, 2004, now Pat. No. 7,095,092.

(51) Int. Cl.
*H01L 21/8222* (2006.01)
(52) U.S. Cl. ............................ 438/328; 438/514
(58) Field of Classification Search ................. 438/237, 438/328, 514, 527
See application file for complete search history.

(56) References Cited

U.S. PATENT DOCUMENTS

| 4,345,163 | A | 8/1982 | Davis et al. |
| 5,959,332 | A | 9/1999 | Ravanelli et al. |
| 6,093,620 | A | 7/2000 | Peltzer |
| 6,288,424 | B1 | 9/2001 | Ludikhuize |
| 6,593,629 | B2 | 7/2003 | Yamamoto |

OTHER PUBLICATIONS

Zhu et al; "Suppression of substrate injection by RESURF LDMOS devices in a smart power technology for 20-30V applications" IEEE, 1998.

*Primary Examiner*—Thien F Tran
(74) *Attorney, Agent, or Firm*—Susan C. Hill; Michael Balconi-Lamica

(57) ABSTRACT

In one embodiment, semiconductor device 10 comprises a diode which uses isolation regions (34, 16, and 13) and a plurality of dopant concentrations (30, 20, 24, and 26) which may be used to limit the parasitic current that is injected into the semiconductor substrate (12). Various biases on the isolation regions (34, 16, and 13) may be used to affect the behavior of semiconductor device (10). In addition, a conductive layer (28) may be formed overlying the junction between anode (42) and cathode (40). This conductive layer (28) may decrease the electric field in selected regions in order to increase the maximum voltage that may be applied to cathode (40).

20 Claims, 1 Drawing Sheet

US 7,476,593 B2

SEMICONDUCTOR DEVICE AND METHOD OF FORMING THE SAME

FIELD OF THE INVENTION

The present invention relates generally to semiconductors, and more particularly to a semiconductor device and method of forming the same.

RELATED ART

For integrated circuits, it is often important to limit the current which is injected by a semiconductor device into its semiconductor substrate. This is particularly important for power integrated circuits which operate at higher voltages and currents. Also, it is desirable to increase the maximum voltage that may be used with a power integrated circuit.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The rapid evolution of SMARTMOS technologies to integrate power devices along with analog and CMOS (complementary metal oxide semiconductor) on the same chip has created the opportunity for systems-on-a-chip solutions. Power management in automotive, portable, and computer peripheral applications drive the need for a versatile smart power technology capable of operating from lower battery voltages all the way up to high voltages in the tens of volts. However, some conventional semiconductor devices, such as diodes, may suffer from the problem of parasitic substrate injection in certain situations. Integration of a high voltage isolated diode device into a smart power technology for the purpose of suppressing substrate injection requires a new structure and method of forming.

Figure 1:
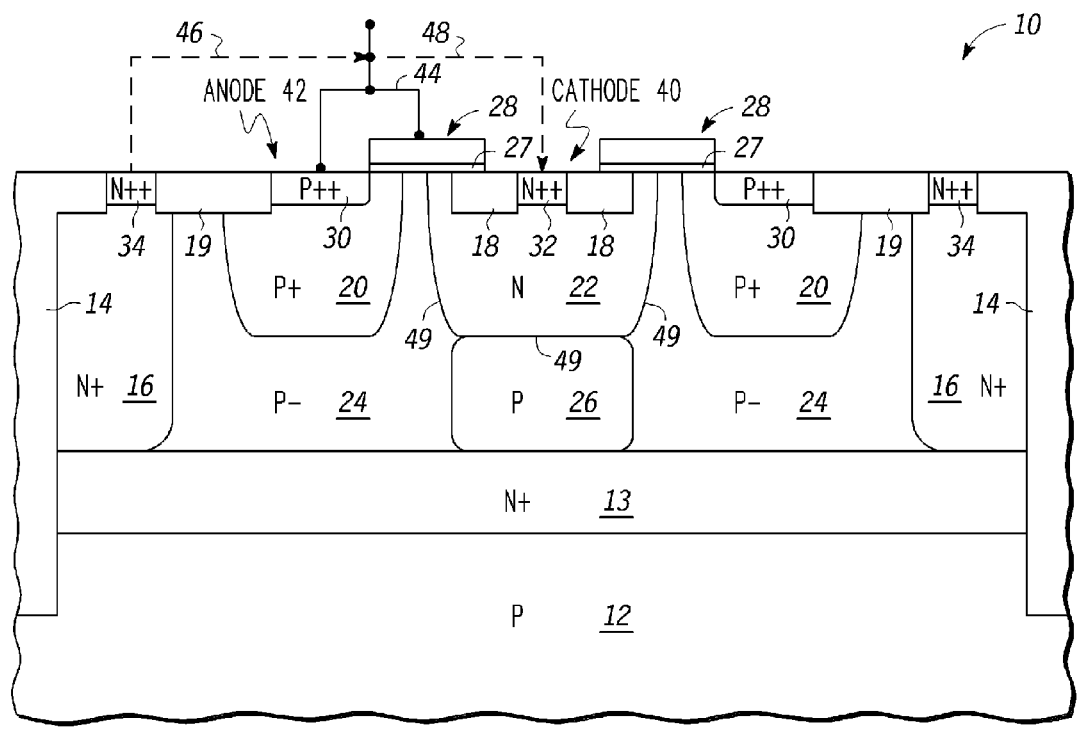
FIG. 1 illustrates, in cross-sectional view, a semiconductor device in accordance with one embodiment of the present invention.

FIG. 1 illustrates, in cross-sectional view, a semiconductor device in accordance with one embodiment of the present invention. As used in FIG. 1, "P−, P, P+, and P++" will represent semiconductor material having P-type conductivity, wherein the dopant concentrations vary from lowest dopant concentrations for P−, higher dopant concentration for P, even higher dopant concentration for P+, and the highest dopant concentration for P++. Similarly, "N, N+, and N++" will represent semiconductor material having N-type conductivity, wherein the dopant concentrations vary from lowest dopant concentrations for N, higher dopant concentration for N+, and the highest dopant concentration for N++.

In the embodiment of the present invention illustrated in FIG. 1, the semiconductor device 10 is a diode, where the anode 42 is formed from P++ region 30, P+ region 20, P− region 24, and P region 26, and the cathode 40 is formed from N++ region 32 and N region 22. P region 12 is a semiconductor substrate and N+ region 13 may be a buried layer, or alternately may be an N+ layer formed in any manner. N+ region 16 may be implemented as a conductive sinker. N+ region 16, in combination with N+ layer 13, forms a conductive isolation tub or conductive isolation feature which may be used to conductively isolate diode 10 from the rest of the integrated circuit. Dielectric layer 14 may be used to surround diode 10. Dielectric layer 14 forms an electrical isolation barrier which may be used to electrically isolate diode 10 from the rest of the integrated circuit. Note that dielectric layer 14 may be formed of any dielectric material. Oxide is just one possible dielectric material that may be used. Any other appropriate material may be used, such as, for example, oxide and polysilicon combinations.

Anode 42 includes P++ region 30, cathode 40 includes N++ region 32, and isolation region 16 includes N++ region 34. These regions 30, 32, and 34 are all heavily doped in order to allow for good ohmic contact, and thus may be called ohmic regions herein. In some embodiments of the present invention, metal contacts (not shown) may be formed overlying regions 30, 32, and 34 respectively.

In the illustrated embodiment of the present invention, a dielectric layer 27 is formed overlying the junction between the anode 42 and the cathode 40. Note that dielectric layer 27 may be formed of any dielectric material. In one embodiment, a thin oxide layer is used to form dielectric layer 27. A conductive layer 28 is formed overlying the dielectric layer 27. Note that the conductive layer 28 may be formed of any conductive or semi-conductive material. In one embodiment, a polysilicon layer is used to form conductive layer 28. Note also that each of dielectric layer 27 and conductive layer 28 may be formed using a plurality of layers.

In the illustrated embodiment of the present invention, a dielectric layer 19 is formed between the anode 42 and N+ region 16. Note that dielectric layer 19 may be formed of any dielectric material. In one embodiment, a field oxide layer is used to form dielectric layer 19. Oxide is just one possible dielectric material that may be used. Any other appropriate dielectric material may be used.

In the illustrated embodiment of the present invention, a dielectric layer 18 is formed as a ring around the N++ region 32. Note that dielectric layer 18 may be formed of any dielectric material. In some embodiments, a field oxide layer is used to form dielectric layer 18. Oxide is just one possible dielectric material that may be used. Any other appropriate dielectric material may be used. In some embodiments, dielectric layer 18 may be a shallow trench isolation region. One purpose for dielectric layer 18 is to support a higher voltage difference between N++ region 32 and conductive layer or conductive plate 28. Alternate embodiments of the present invention may not use dielectric layer 18 and may instead allow the other regions to extend up to the surface plane (i.e. the surface plane adjacent to the bottom surface of layer 27).

In one embodiment of the present invention, anode 42 is electrically coupled to conductive layer 28 by way of conductive layer 44. Conductive layer 44 has not been illustrated with any specific topology to make clear that any desired topology may be used. Conductive layer 44 may be formed using any conductive material that can be formed on a semiconductor device 10.

Alternate embodiments of the present invention may electrically bias the N isolation region formed by N++ region 34, N+ region 16, and N+ region 13 in order to reduce the parasitic current injected into substrate 12 from the vertical parasitic NPN and PNP devices. Note that in the illustrated embodiment, the vertical parasitic NPN transistor has a first N region formed from regions 32 and 22, has a P region formed from regions 30, 20, 24, and 26, and has a second N region formed from region 13. Similarly, the vertical parasitic PNP transistor has a first P region formed from regions 30, 20, 24, and 26, has an N region formed from region 13, and has a second P region formed from region 12.

If the N++ region 34 is electrically coupled (e.g. shorted) to anode 42, the emitter and base of the vertical parasitic PNP transistor are at approximately the same voltage, and thus there is no emitter/base bias. Consequently, the vertical parasitic PNP transistor produces very little collector current which is injected into P substrate 12. Also, if the N++ region 34 is electrically coupled (e.g. shorted) to anode 42, the base and collector of the vertical parasitic NPN transistor are at approximately the same voltage; and thus there is no way for the collector voltage to drop below ground to a negative voltage. If the collector was allowed to drop to a negative voltage, then the junction between the N+ region 13 and the P substrate 12 may form a conducting diode junction, thus injecting current into substrate 12.

If the N++ region 34 is electrically coupled (e.g. shorted) to cathode 40, it will be possible to support a higher voltage on cathode 40. Electrically coupling N++ region 34 and cathode 40 produces a negative bias on the junction between N region 22 and P region 26, and also on the junction between P region 26 and N+ region 13. These two reverse bias junctions together reduce the electrical field in N region 22, particularly those portions of N region 22 which are closest to P– region 24 and closest to dielectric layer 18. This reduced electric field allows a higher maximum voltage to be supported on cathode 40.

If the N++ region 34 is not electrically coupled to either anode 42 or cathode 40 and is allowed to electrically float, it will be possible to support an even higher voltage on cathode 40. If the voltage of N+ region 13 is allowed to float, then the maximum voltage supported on cathode 40 will not be limited by the physical distance between P+ region 20 and N+ region 13, but will be limited by other characteristics of device 10 (e.g. doping concentrations of regions N+ region 13 and P region 12).

In one embodiment of the present invention, anode 42 includes a plurality of dopant concentrations. In one embodiment, P++ region 30 has a dopant concentration on the order of 1E20, P+ region 20 has a dopant concentration in the range of 2E17 to 4E17, P– region 24 has a dopant concentration in the range of 1E15 to 5E15, and P region 26 has a dopant concentration in the range of 2E16 to 5E16. These dopant concentrations are given just for illustrative purposes only. Alternate embodiments of the present invention may use any appropriate dopant concentrations. Note that the heavy dopant concentration in P++ region 30 is for the purpose of forming a good ohmic contact with an overlying conductive layer (not shown). Thus P++ region 30 may be called an ohmic region herein. Note that for some embodiments of the present invention, there is at least an order of magnitude (i.e. one power of ten) difference between the lowest P-type dopant concentration used in anode 42 and the highest P-type dopant concentration used in anode 42. Alternate embodiments of the present invention may have at least two orders of magnitude (i.e. two powers of ten, or 100 times) difference between the lowest P-type dopant concentration used in anode 42 and the highest P-type dopant concentration used in anode 42. Note that alternate embodiments of the present invention may designate the difference between the lowest and the highest dopant concentrations at any desired point between 0 (i.e. no difference) and the maximum difference allowed by integrated circuit fabricating technology.

In one embodiment of the present invention, cathode 40 includes a plurality of dopant concentrations. In one embodiment, N++ region 32 has a dopant concentration on the order of 5E20, N region 22 has a dopant concentration in the range of 3E16 to 6E16. These dopant concentrations are given just for illustrative purposes only. Alternate embodiments of the present invention may use any appropriate dopant concentrations. Note that the heavy dopant concentration in N++ region 32 is for the purpose of forming a good ohmic contact with an overlying conductive layer (not shown). Thus N++ region 32 may be called an ohmic region herein. Interface 49 forms an anode/cathode junction interface between anode 42 and cathode 40.

In one embodiment of the present invention, the isolation region (34, 16, 13) includes a plurality of dopant concentrations. In one embodiment, N++ region 34 has a dopant concentration on the order of 5E20, N+ region 16 has a dopant concentration in the range of 5E17 to 8E17, and N+ region 13 has a dopant concentration in the range of 1E18 to 5E18. These dopant concentrations are given just for illustrative purposes only. Alternate embodiments of the present invention may use any appropriate dopant concentrations. Note that the heavy dopant concentration in N++ region 34 is for the purpose of forming a good ohmic contact with an overlying conductive layer (not shown). Thus N++ region 34 may be called an ohmic region herein.

For alternate embodiments of the present invention, P substrate 12 may be doped to form a P+ substrate 12. In an alternate embodiment of the present invention, substrate 12 may be a P++ substrate having an overlying P-type epitaxial layer formed thereon. Then implantation and diffusion may be used to form an N-type buried layer which serves a similar function as the N+ region 13 illustrated in FIG. 1. Then a second P-type epitaxial layer may be deposited overlying the N-type buried layer. This second P-type epitaxial layer may serve a similar function as the P– region 24 illustrated in FIG. 1. Then implantation may be used to form the P region 26 and the N region 22. Note that for some embodiments, the same implantation mask may be used to form regions 26 and 22. Next, etching and oxide deposition may be performed to form layers 14, 18, and 19. Then implantation may be used to form the P+ region 20, and a separate implantation may be used to form N+ region 16. Alternate embodiments of the present invention may use a plurality of implant steps and masks for forming N+ region 16. Next, oxide deposition may be performed to form layer 27, and polysilicon deposition may be performed to form layer 28. Then implantation may be used to form the N++ regions 32 and 34, and a separate implantation may be used to form P++ region 30. Alternate embodiments of the present invention may use any appropriate alternate processing steps, in any appropriate order, to form various embodiments of semiconductor device 10.

Figure 2:
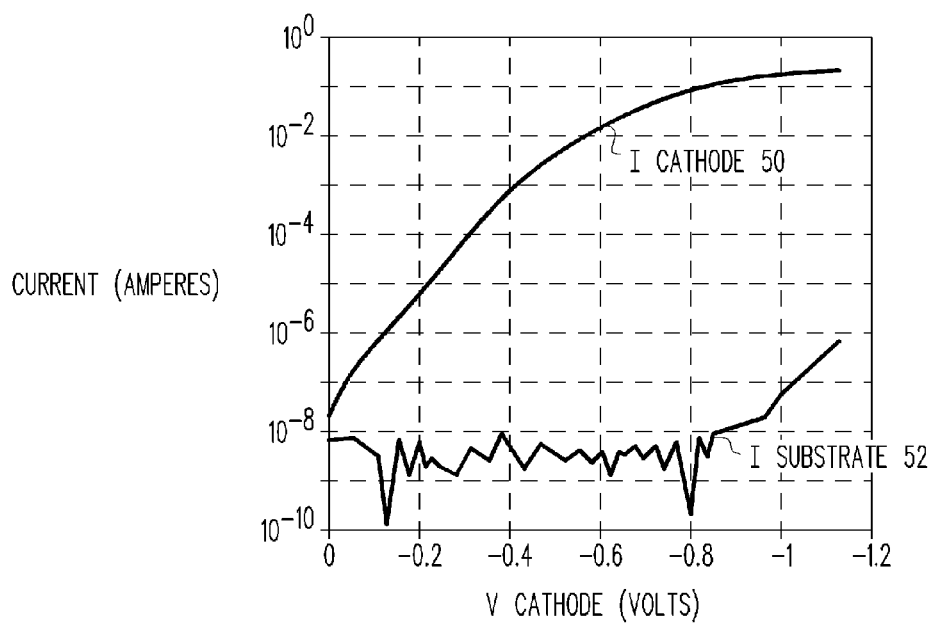
FIG. 2 illustrates, in graphical form, a current versus voltage (cathode to anode voltage) graph illustrating cathode current and substrate current produced by the semiconductor device of FIG. 1.

FIG. 2 illustrates, in graphical form, a current versus voltage (cathode to anode voltage) graph illustrating cathode current (Icathode 50) and substrate current (Isubstrate 52) produced by the semiconductor device 10 of FIG. 1. Note that the parasitic current (Isubstrate 52) injected into substrate 12 (see FIG. 1) is approximately six orders of magnitude less than the cathode current (Icathode 50). FIG. 2 assumes that N++ region 34 (the isolation region) has been shorted to the anode 42 and both are approximately 0 Volts, the voltage of cathode 40 is pulled below 0 Volts, substrate 12 is biased to −10 volts, and the temperature of semiconductor device 10 is approximately 150 degrees Celsius. Increasing the width of N+ region 16 beyond 10 micrometers may further reduce the cathode current injected into substrate 12; however, a tradeoff often must be made between the amount of semiconductor area required to form semiconductor device 10 and the electrical performance of semiconductor device 10. Note that for conventional non-isolated diodes, the parasitic current injected into the substrate is approximately 10% of the cathode current. Thus a conventional non-isolated diode injects a very large amount of parasitic current into the substrate, causing potential malfunctions of adjacent circuitry formed on the same integrated circuit.

Although the invention has been described with respect to specific conductivity types or polarity of potentials, skilled artisans appreciated that conductivity types and polarities of potentials may be reversed. Also, the semiconductor materials used to form the various portions of semiconductor device 10 may be any appropriate material. For example, substrate 12 may be silicon or any another appropriate semiconductor material. Also, semiconductor device 10 may be incorporated into a power integrated circuit which is operable for high voltages and high currents.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of forming a semiconductor device, comprising:
   providing a substrate of a first conductivity type;
   implanting a buried layer of a second conductivity type, the buried layer forming a portion of a conductive isolation feature;
   depositing an epitaxial layer of the first conductivity type overlying the buried layer, wherein a portion of the epitaxial layer forms a first portion of an anode;
   implanting first and second regions with the first conductivity type and the second conductivity type, respectively, the first region corresponding to a second portion of the anode and the second region corresponding to a first portion of a cathode;
   etching regions for oxide isolation and depositing oxide into the etched regions;
   implanting a third region with the first conductivity type, the third region corresponding to a third portion of the anode; and
   implanting a fourth region with the second conductivity type, the fourth region forming a second portion of the conductive isolation feature.

2. The method of claim 1, wherein the anode includes a plurality of dopant concentrations, wherein the dopant concentration of one portion is on an order of magnitude higher than the dopant concentration of another portion, wherein neither portion is used to make an ohmic contact.

3. The method of claim 1, wherein the anode is disposed adjacent the cathode and forms an anode/cathode junction interface.

4. The method of claim 1, wherein the conductive isolation feature includes the buried layer and a conductive sinker conductively coupled to the buried layer, wherein the buried layer is disposed between the substrate and a region of the anode and cathode, and wherein the conductive sinker surrounds the region of the anode and cathode from sides of the region.

5. The method of claim 1, wherein the second portion of the conductive isolation feature includes a conductive sinker, the conductive sinker extending from a surface of the second portion down to the buried layer, and wherein etching regions for oxide isolation and depositing oxide into the etched regions includes forming a dielectric isolation region disposed within a portion of the semiconductor device between a top of the anode and a top of the conductive sinker of the conductive isolation feature.

6. A method of forming a semiconductor device, comprising:
   providing a substrate of a first conductivity type;
   forming an anode of the first conductivity type, the anode including a plurality of dopant concentrations, wherein the dopant concentration of a first portion is on an order of magnitude higher than the dopant concentration of a second portion, wherein neither the first portion or the second portion are used to make an ohmic contact;
   forming a cathode of a second conductivity type different from the first conductivity type, the anode being disposed adjacent the cathode and forming an anode/cathode junction interface;
   forming a conductive isolation feature of the second conductivity type, wherein the conductive isolation feature includes a buried layer and a conductive vertical portion conduetively coupled to the buried layer, wherein the buried layer is disposed between the substrate and a region of the anode and cathode, and wherein the conductive vertical portion surrounds the region of the anode and cathode from sides of the region, and wherein the conductive isolation feature forms a junction with the substrate; and
   forming a dielectric isolation region disposed within a portion of the semiconductor device between a top of the anode and a top of the conductive vertical portion of the conductive isolation feature.

7. The method of forming the semiconductor device of claim 6, wherein the substrate includes a P-type substrate.

8. The method of forming the semiconductor device of claim 7, further wherein the P-type substrate includes a P-type epitaxial layer overlying the substrate.

9. The method of forming the semiconductor device of claim 6, wherein the plurality of dopant concentrations include separate portions of high, low, and intermediate dopant concentrations.

10. The method of forming the semiconductor device of claim 9, wherein the high dopant concentration is on the order of 2E17-5E17, the low dopant concentration is on the order of 1E15-5E15, and the intermediate dopant concentration is on the order of 2E16-5E16.

11. The method of forming the semiconductor device of claim 6, wherein the cathode has a dopant concentration on the order of 3E16-6E16.

12. The semiconductor device of claim 6, wherein the conductive vertical portion extends from a surface of the region down to the buried layer.

13. The method of forming the semiconductor device of claim 6, wherein a width of the conductive vertical portion controls an amount of parasitic current injected into the substrate resulting from parasitic transistors formed by vertical NPN and vertical PNP regions.

14. The method of forming the semiconductor device of claim 6, wherein the buried layer includes an N buried layer and the conductive vertical portion includes an N+conductive sinker.

15. The method of forming the semiconductor device of claim 6, wherein the conductive isolation feature is electrically coupled to one of the anode and the cathode.

16. The method of forming the semiconductor device of claim 6, wherein the device is isolated from the substrate by the junction formed between the conductive isolation feature and the substrate.

17. The method of forming the semiconductor device of claim 6, further comprising:
  forming a dielectric overlying a region between the anode and the cathode, including at least a portion across the anode/cathode junction; and
  forming a conductive layer overlying the dielectric, wherein the conductive layer is electrically coupled to the anode.

18. The method of forming the semiconductor device of claim 6, wherein the semiconductor device is incorporated into a power integrated circuit, operable for high voltages and high currents.

19. The method of forming the semiconductor device of claim 6, further comprising:
  providing a trench dielectric isolation region surrounding the conductive isolation feature from sides of the conductive isolation feature, the trench dielectric isolation region extending from a surface of the conductive isolation feature down into the substrate.

20. A method of forming a semiconductor device, comprising:
  providing a substrate of a first conductivity type;
  forming an anode of the first conductivity type, the anode including a plurality of dopant concentrations, wherein the dopant concentration of a first portion is on an order of magnitude higher than the dopant concentration of a second portion, wherein neither the first portion or the second portion are used to make an ohmic contact;
  forming a cathode of a second conductivity type different from the first conductivity type, the anode being disposed adjacent the cathode and forming an anode/cathode junction interface;
  forming a conductive isolation feature of the second conductivity type, wherein the conductive isolation feature includes a buried layer and a conductive vertical portion conductively coupled to the buried layer, wherein the buried layer is disposed between the substrate and a region of the anode and cathode, and wherein the conductive vertical portion surrounds the region of the anode and cathode from sides of the region; and
  forming a dielectric isolation region disposed within a portion of the semiconductor device between a top of the anode and a top of the conductive vertical portion of the conductive isolation feature,
  wherein the conductive isolation feature is electrically coupled to one of the anode and the cathode.

* * * * *